(12) United States Patent
Li

(10) Patent No.: US 7,825,738 B2
(45) Date of Patent: *Nov. 2, 2010

(54) METHOD AND SYSTEM FOR IMPLEMENTING A LOW POWER, HIGH PERFORMANCE FRACTIONAL-N PLL

(75) Inventor: Dandan Li, San Diego, CA (US)

(73) Assignee: Broadcom Corporation, Irvine, CA (US)

(*) Notice: Subject to any disclaimer, the term of this patent is extended or adjusted under 35 U.S.C. 154(b) by 158 days.

This patent is subject to a terminal disclaimer.

(21) Appl. No.: 11/618,651

(22) Filed: Dec. 29, 2006

(65) Prior Publication Data

US 2008/0136534 A1 Jun. 12, 2008

Related U.S. Application Data

(60) Provisional application No. 60/868,818, filed on Dec. 6, 2006.

(51) Int. Cl.
*H03L 7/085* (2006.01)
(52) U.S. Cl. .................. 331/17; 331/25; 327/157
(58) Field of Classification Search .............. 331/16, 331/17, 25; 327/156, 157, 148
See application file for complete search history.

(56) References Cited

U.S. PATENT DOCUMENTS

| | | | | |
|---|---|---|---|---|
| 5,038,117 A * | 8/1991 | Miller | | 331/16 |
| 5,151,665 A * | 9/1992 | Wentzler | | 331/8 |
| 6,057,739 A * | 5/2000 | Crowley et al. | | 331/14 |
| 6,192,094 B1 * | 2/2001 | Herrmann et al. | | 375/375 |
| 6,327,319 B1 * | 12/2001 | Hietala et al. | | 375/374 |
| 7,173,494 B2 * | 2/2007 | Robinson et al. | | 331/14 |
| 2005/0258907 A1 * | 11/2005 | Zachan et al. | | 331/16 |
| 2008/0136533 A1 * | 6/2008 | Li | | 331/16 |

OTHER PUBLICATIONS

Shu, et al., "CMOS PLL Synthesizers: Analysis and Design", Apr. 2005, Springer US, vol. 783, p. 32.*

Q. Huang and R. Rogenmoser, "Speed Optimization of Edge-Triggered CMOS CircuitsFor Gigahertz Single-Phase Clock," IEEE JSSC, vol. 31, No. 3, pp. 456-464, Mar. 1996.

(Continued)

*Primary Examiner*—Robert Pascal
*Assistant Examiner*—Ryan Johnson
(74) *Attorney, Agent, or Firm*—McAndrews Held & Malloy, Ltd.

(57) ABSTRACT

Aspects of a method and system for implementing a low power, high performance fractional-N PLL synthesizer are provided. The synthesizer comprises a reference generator/buffer, a charge pump, a divider, a VCO, a loop filter, and a phase-frequency detector (PFD). The reference generator/buffer may increase the frequency of the input reference signal to the PFD. The PFD may generate a single signal for controlling the charge pump utilizing the increased frequency input reference signal and a divider signal generated by the divider whose input frequency may be substantially the same as that of a VCO output signal. The single signal charges a charge up portion of the charge pump and a charge down portion is charged by a leakage current. The VCO signal may be generated based on a filtered output of the charge pump generated by the loop filter. The divider may utilize true single phase clock (TSPC) logic.

20 Claims, 4 Drawing Sheets

OTHER PUBLICATIONS

H. Huh, Y. Koo, K. Lee, Y. Ok, S. Lee D. Kwon, J. Lee, Joonbae Park, D. Lee, D. Jeong and W. Kim, "Comparison Frequency Doubling and Charge Pump Matching Techniques for Dual-Band Fractional-N Frequency Synthesizer," IEEE JSSC, vol. 40, No. 11, pp. 2228-2236, Nov. 2005.

S. Pellerano, S. Levantino, C. Samori, and L. Lacaita, "A 13.5-mW 5 GHz Frequency Synthesizer With Dynamic-Logic Frequency Divider," IEEE JSSC, vol. 39, No. 2, pp. 378-383, Feb. 2004.

J. Yuan and C. Svensson, "High-Speed CMOS Circuit Technique," IEEE JSSC. vol. 24, No. 1, pp. 62-70, Feb. 1989.

M. Kozak and E. Friedman, "Design and Simulation of Fractional-N PLL Frequency Synethesizers," IEEE ISCAS, pp. 780-783, May 2004.

* cited by examiner

METHOD AND SYSTEM FOR IMPLEMENTING A LOW POWER, HIGH PERFORMANCE FRACTIONAL-N PLL

CROSS-REFERENCE TO RELATED APPLICATIONS/INCORPORATION BY REFERENCE

This patent application makes reference to, claims priority to and claims benefit from U.S. Provisional Patent Application Ser. No. 60/868,818, filed on Dec. 6, 2006.

This application also makes reference to:

U.S. application Ser. No. 11/618,655 filed on even date herewith;

U.S. application Ser. No. 11/618,718 filed on even date herewith; and

U.S. application Ser. No. 11/618,715 filed on even date herewith.

Each of the above stated applications is hereby incorporated by reference in its entirety.

FIELD OF THE INVENTION

Certain embodiments of the invention relate to signal processing. More specifically, certain embodiments of the invention relate to a method and system for implementing a low power, high performance fractional-N phase-locked-loop (PLL).

BACKGROUND OF THE INVENTION

Wireless Local Area Networks (WLANs) have gained significant popularity and are widely deployed because of the flexibility and convenience in connectivity that they provide. WLANs enable connections to devices that are located within somewhat large geographical areas, such as the area covered by a building or a campus, for example. WLAN systems are based on IEEE 802.11 standard specifications, which typically operate within a 100-meter range, and are generally utilized to supplement the communication capacity provided by traditional wired Local Area Networks (LANs) installed in the same geographic area as the WLAN systems.

The introduction of networks based on the new IEEE 802.11n standard specifications promises to at least double the theoretical wireless bandwidth of today's 54 Mbit/s data rates supported by IEEE 802.11a/g networks, for example. In fact, networks based on the proposed IEEE 802.11n specifications may be able to offer up to 10 times the capacity offered by current WLAN systems.

Because of the increases in data rates supported by forthcoming WLAN systems, more demanding specifications may be required for the design of frequency synthesizers used in wireless terminals, such as mobile devices, for example, and/or in access points (APs) to generate the reference signals used for IEEE 802.11n operation. WLAN radios may also be integrated into a cellular phone. For such embedded application, a frequency synthesizer may need to be able to operate over a wide range of reference frequencies. At the same time, loop bandwidth may have to be sufficiently high to meet settling requirements when a WLAN radio is switched between receiving and transmitting operations.

Optimizing the design of a frequency synthesizer requires that both high bandwidth and low phase noise specifications are met simultaneously, a task that may generally be difficult to achieve. In this regard, fractional-N phase-locked-loop (PLL) frequency synthesizers may be utilized in wireless terminals to try to meet simultaneous fine resolution and high bandwidth. The fractional-N PLL frequency synthesizer enables dithering a divide value between integer values in order to produce a fractional divide value that is utilized in the frequency synthesizer's feedback loop. However, the dithering operation may generally introduce quantization noise into the frequency synthesizer, negatively impacting the overall phase noise performance. Moreover, as the bandwidth in the loop increases more quantization noise appears at the output. However, a higher bandwidth may better suppress the noise contributed by a voltage controlled oscillator (VCO). When trying to achieve a given noise specification, different noise sources inside the PLL may result in conflicting requirements on loop bandwidth. In this regard, performance optimization becomes an important aspect of the frequency synthesizer design.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for implementing a low power, high performance fractional-N phase-locked-loop (PLL), substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for implementing a low power, high performance fractional-N phase-locked-loop (PLL). Aspects of the invention may relate to a frequency synthesizer utilized in a wireless or mobile terminal that comprises a charge pump, a divider, a VCO, a loop filter, a phase-frequency detector (PFD), and a reference generator/buffer. The synthesizer may be integrated onto a chip, for example. The reference generator/buffer may provide a reference signal to the PFD at higher frequency than that provided by an off-chip source or an off-chip frequency selection component such as a crystal, for example. The PFD may generate a single signal for controlling the charge pump utilizing the increased frequency input reference signal and a divider signal generated by the divider whose input frequency may be substantially the same as that of a VCO signal generated by the VCO. The single signal controls a charge up portion of the charge pump and a charge down portion is a constant leakage current. The VCO signal may be generated based on a filtered output of the charge pump generated by the loop filter. The divider may utilize true single phase clock (TSPC) logic to generate the divider signal. The divider may be a multi-modulus divider (MMD).

Figure 1A:
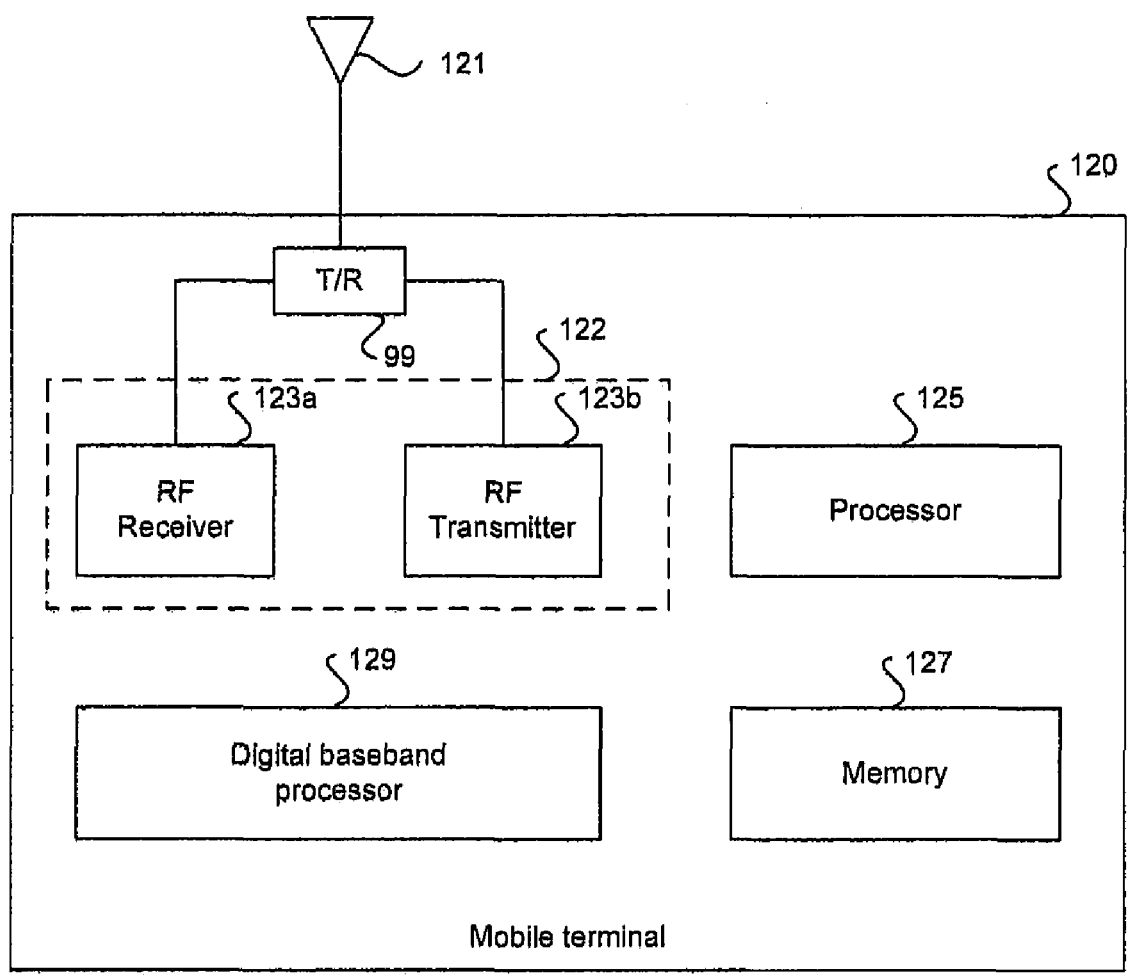
FIG. 1A is a block diagram illustrating an exemplary wireless terminal, in accordance with an embodiment of the invention.

FIG. 1A is a block diagram illustrating an exemplary wireless terminal, in accordance with an embodiment of the invention. Referring to FIG. 1A, there is shown a wireless terminal 120 that may comprise an RF receiver 123a, an RF transmitter 123b, a digital baseband processor 129, a processor 125, and a memory 127. In an embodiment of the invention, the RF receiver 123a and the RF transmitter 123b may be integrated into a single RF transceiver 122, for example. A single transmit and receive antenna 121 may be communicatively coupled to the RF receiver 123a and the RF transmitter 123b. A switch or other device having switching capabilities may be coupled between the RF receiver 123a and RF transmitter 123b, and may be utilized to switch the antenna 121 between transmit and receive functions. The wireless terminal 120 may be operated in a system, such as Wireless Local Area Network (WLAN), a cellular network and/or digital video broadcast network, for example. In this regard, the wireless terminal 120 may support a plurality of wireless communication protocols, including the IEEE 802.11n standard specifications for WLAN networks.

The RF receiver 123a may comprise suitable logic, circuitry, and/or code that may enable processing of received RF signals. The RF receiver 123a may enable receiving RF signals in a plurality of frequency bands in accordance with the wireless communications protocols that may be supported by the wireless terminal 120. Each frequency band supported by the RF receiver 123a may have a corresponding front-end circuit for handling low noise amplification and down conversion operations, for example. In this regard, the RF receiver 123a may be referred to as a multi-band receiver when it supports more than one frequency band. In another embodiment of the invention, the wireless terminal 120 may comprise more than one RF receiver 123a, wherein each of the RF receiver 123a may be a single-band or a multi-band receiver. The RF receiver 123a may be implemented on a chip. In an embodiment of the invention, the RF receiver 123a may be integrated with the RF transmitter 123b on a chip to comprise an RF transceiver, for example. In another embodiment of the invention, the RF receiver 123a may be integrated on a chip with more than one component in the wireless terminal 120.

The RF receiver 123a may quadrature down convert the received RF signal to a baseband frequency signal that comprises an in-phase (I) component and a quadrature (Q) component. The RF receiver 123a may perform direct down conversion of the received RF signal to a baseband frequency signal, for example. In some instances, the RF receiver 123a may enable analog-to-digital conversion of the baseband signal components before transferring the components to the digital baseband processor 129. In other instances, the RF receiver 123a may transfer the baseband signal components in analog form.

The digital baseband processor 129 may comprise suitable logic, circuitry, and/or code that may enable processing and/or handling of baseband frequency signals. In this regard, the digital baseband processor 129 may process or handle signals received from the RF receiver 123a and/or signals to be transferred to the RF transmitter 123b, when the RF transmitter 123b is present, for transmission to the network. The digital baseband processor 129 may also provide control and/or feedback information to the RF receiver 123a and to the RF transmitter 123b based on information from the processed signals. The digital baseband processor 129 may communicate information and/or data from the processed signals to the processor 125 and/or to the memory 127. Moreover, the digital baseband processor 129 may receive information from the processor 125 and/or to the memory 127, which may be processed and transferred to the RF transmitter 123b for transmission to the network. In an embodiment of the invention, the digital baseband processor 129 may be integrated on a chip with more than one component in the wireless terminal 120.

The RF transmitter 123b may comprise suitable logic, circuitry, and/or code that may enable processing of RF signals for transmission. The RF transmitter 123b may enable transmission of RF signals in a plurality of frequency bands. Each frequency band supported by the RF transmitter 123b may have a corresponding front-end circuit for handling amplification and up conversion operations, for example. In this regard, the RF transmitter 123b may be referred to as a multi-band transmitter when it supports more than one frequency band. In another embodiment of the invention, the wireless terminal 120 may comprise more than one RF transmitter 123b, wherein each of the RF transmitter 123b may be a single-band or a multi-band transmitter. The RF transmitter 123b may be implemented on a chip. In an embodiment of the invention, the RF transmitter 123b may be integrated with the RF receiver 123a on a chip to comprise an RF transceiver, for example. In another embodiment of the invention, the RF transmitter 123b may be integrated on a chip with more than one component in the wireless terminal 120.

The RF transmitter 123b may quadrature up convert the baseband frequency signal comprising I/Q components to an RF signal. The RF transmitter 123b may perform direct up conversion of the baseband frequency signal to a baseband frequency signal, for example. In some instances, the RF transmitter 123b may enable digital-to-analog conversion of the baseband signal components received from the digital baseband processor 129 before up conversion. In other instances, the RF transmitter 123b may receive baseband signal components in analog form.

The processor 125 may comprise suitable logic, circuitry, and/or code that may enable control and/or data processing operations for the wireless terminal 120. The processor 125 may be utilized to control at least a portion of the RF receiver 123a, the RF transmitter 123b, the digital baseband processor 129, and/or the memory 127. In this regard, the processor 125 may generate at least one signal for controlling operations within the wireless terminal 120. The processor 125 may also enable executing of applications that may be utilized by the wireless terminal 120. For example, the processor 125 may generate at least one control signal and/or may execute applications that may enable current and proposed WLAN communications in the wireless terminal 120.

The memory 127 may comprise suitable logic, circuitry, and/or code that may enable storage of data and/or other information utilized by the wireless terminal 120. For example, the memory 127 may be utilized for storing processed data generated by the digital baseband processor 129 and/or the processor 125. The memory 127 may also be utilized to store information, such as configuration information, that may be utilized to control the operation of at least one block in the wireless terminal 120. For example, the memory 127 may comprise information necessary to configure the RF receiver 123a for receiving WLAN signals in the appropriate frequency band.

Figure 1B:
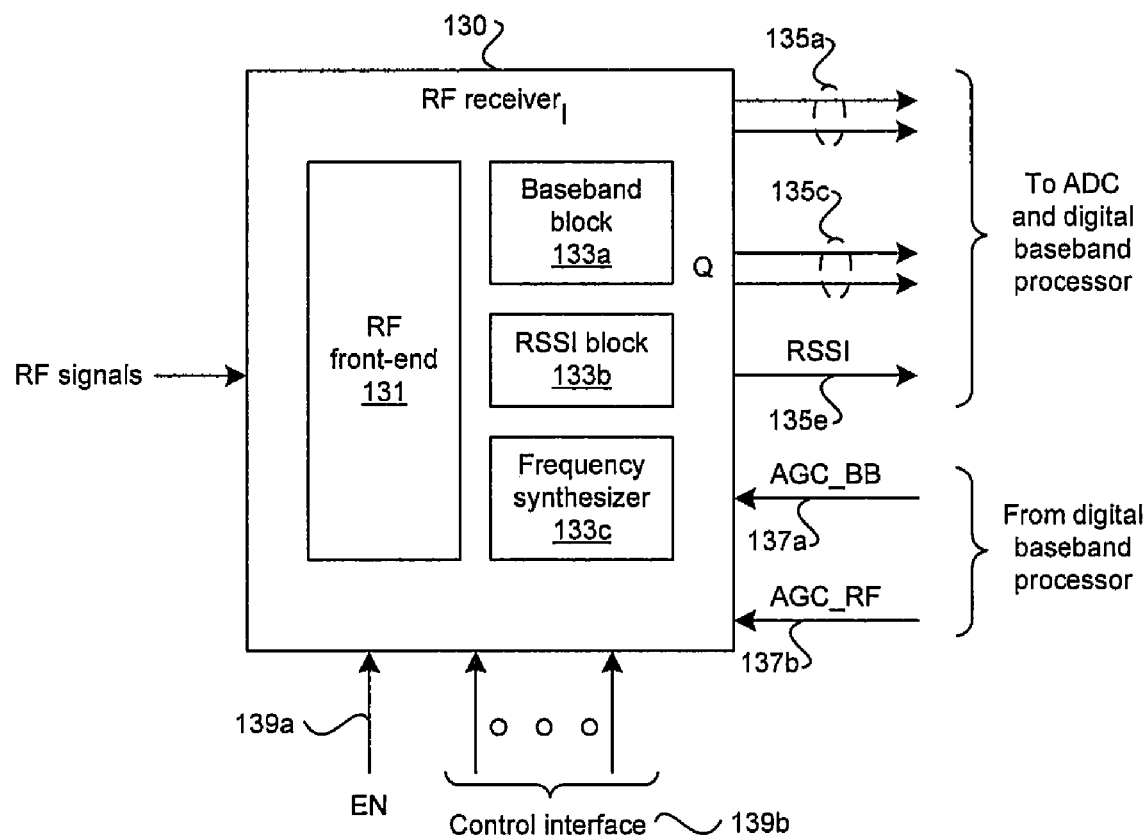
FIG. 1B is a block diagram illustrating an exemplary RF receiver in a mobile terminal, in accordance with an embodiment of the invention.

FIG. 1B is a block diagram illustrating an exemplary RF receiver in a mobile terminal, in accordance with an embodiment of the invention. Referring to FIG. 1B, there is shown an RF receiver 130 that may comprise an RF front-end 131, a baseband block 133a, a received signal strength indicator (RSSI) block 133b, and a frequency synthesizer 133c. The RF receiver 130 may correspond to the RF receiver 123a in the wireless terminal 120 disclosed in FIG. 1A, for example.

The RF receiver 130 may comprise suitable logic, circuitry, and/or code that may enable handling of a plurality of RF signals that may comprise signals in accordance with the IEEE 802.11n standard specifications for WLAN networks. The RF receiver 130 may be enabled via an enable signal, such as the signal EN 139a, for example. At least a portion of the circuitry within the RF receiver 130 may be controlled via the control interface 139b. The control interface 139b may receive information from, for example, a processor, such as the processor 125 and/or the digital baseband processor 129 disclosed in FIG. 1A. The control interface 139b may comprise more than one bit. For example, when implemented as a 2-bit interface, the control interface 139b may be an inter-integrated circuit (I2C) interface.

The RF front-end 131 may comprise suitable logic, circuitry, and/or code that may enable low noise amplification and direct down conversion of RF signals. In this regard, the RF front-end 131 may utilize an integrated low noise amplifier (LNA) and mixers, such as passive mixers, for example. The RF front-end 131 may communicate the resulting baseband frequency signals to the baseband block 133a for further processing. In an embodiment of the invention, the RF front-end 131 may enable receiving RF signals in a plurality of frequency bands that may comprise the frequency band utilized for WLAN communications. In this regard, the RF front-end 131 may be implemented by utilizing separate RF front-end blocks for each of the frequency bands supported, for example.

The frequency synthesizer 133c may comprise suitable logic, circuitry, and/or code that may enable generating the appropriate local oscillator (LO) signal or reference signal for performing down conversion in the RF front-end 131. Since the frequency synthesizer 133c may enable fractional multiplication of a source frequency when generating the LO signal, a large range of crystal oscillators may be utilized as a frequency source for the frequency synthesizer 133c. This approach may enable the use of an existing crystal oscillator in a mobile terminal PCB, thus reducing the number of external components necessary to support the operations of the RF receiver 130, for example. In some instances, the frequency synthesizer 133c may have at least one integrated voltage controlled oscillator (VCO) for generating the LO signal. For example, the frequency synthesizer 133c may be implemented based on fractional-N phase-locked-loop (PLL) synthesizer design to enable high bandwidth and to achieve low phase noise specifications. In this regard, the design of the frequency synthesizer 133c may be required to support higher data rates, such as the data rates specified in the IEEE 802.11n standard for WLAN networks, for example.

The baseband block 133a may comprise suitable logic, circuitry, and/or code that may enable processing of I/Q components generated from the down conversion operations in the RF front-end 131. The baseband block 133a may enable amplification and/or filtering of the I/Q components in analog form. The baseband block 133a may also enable communication of the processed I component, that is, signal 135a, and of the processed Q component, that is, signal 135c, to an analog-to-digital converter (ADC) for digital conversion before being communicated to the digital baseband processor 129, for example.

The RSSI block 133b may comprise suitable logic, circuitry, and/or code that may enable measuring the strength, that is, the RSSI value, of a received RF signal. The RSSI block 133b may be implemented based on a logarithmic amplifier, for example. The RSSI measurement may be performed, for example, after the received RF signal is amplified in the RF front-end 131. The RSSI block 133b may enable communication of the analog RSSI measurement, that is, signal 135e, to an ADC for digital conversion before being communicated to the digital baseband processor 129, for example.

The RF receiver 130 may enable receiving at least one signal, such as the signals AGC_BB 137a and AGC_RF 137b, from the digital baseband processor 129 for adjusting operations of the RF receiver 130. For example, the signal AGC_BB 137a may be utilized to adjust the gain provided by the baseband block 133a on the baseband frequency signals generated from the RF front-end 131. In another example, the signal AGC_RF 137b may be utilized to adjust the gain provided by an integrated LNA in the RF front-end 131. In this regard, the signal AGC_RF 137b may be utilized to adjust the gain during a calibration mode, for example. In another example, the RF receiver 130 may enable receiving from the digital baseband processor 129 at least one control signal or control information via the control interface 139b for adjusting operations within the RF receiver 130.

Notwithstanding that the frequency synthesizer 133c has been shown as comprised within the RF receiver 130, aspects of the invention need not be so limited. In this regard, a frequency synthesizer integrated within an RF receiver may also be utilized with an RF transmitter, such as the RF transmitter 123b disclosed in FIG. 1A, for example. In some instances, a frequency synthesizer may be integrated within the RF transmitter and may be utilized by the RF receiver. In other instances, the frequency synthesizer may be implemented separate from the RF transmitter or the RF receiver, for example. Moreover, when a single RF transceiver is utilized with the wireless terminal 120, the frequency synthesizer may be integrated within the single RF transceiver.

Figure 1C:
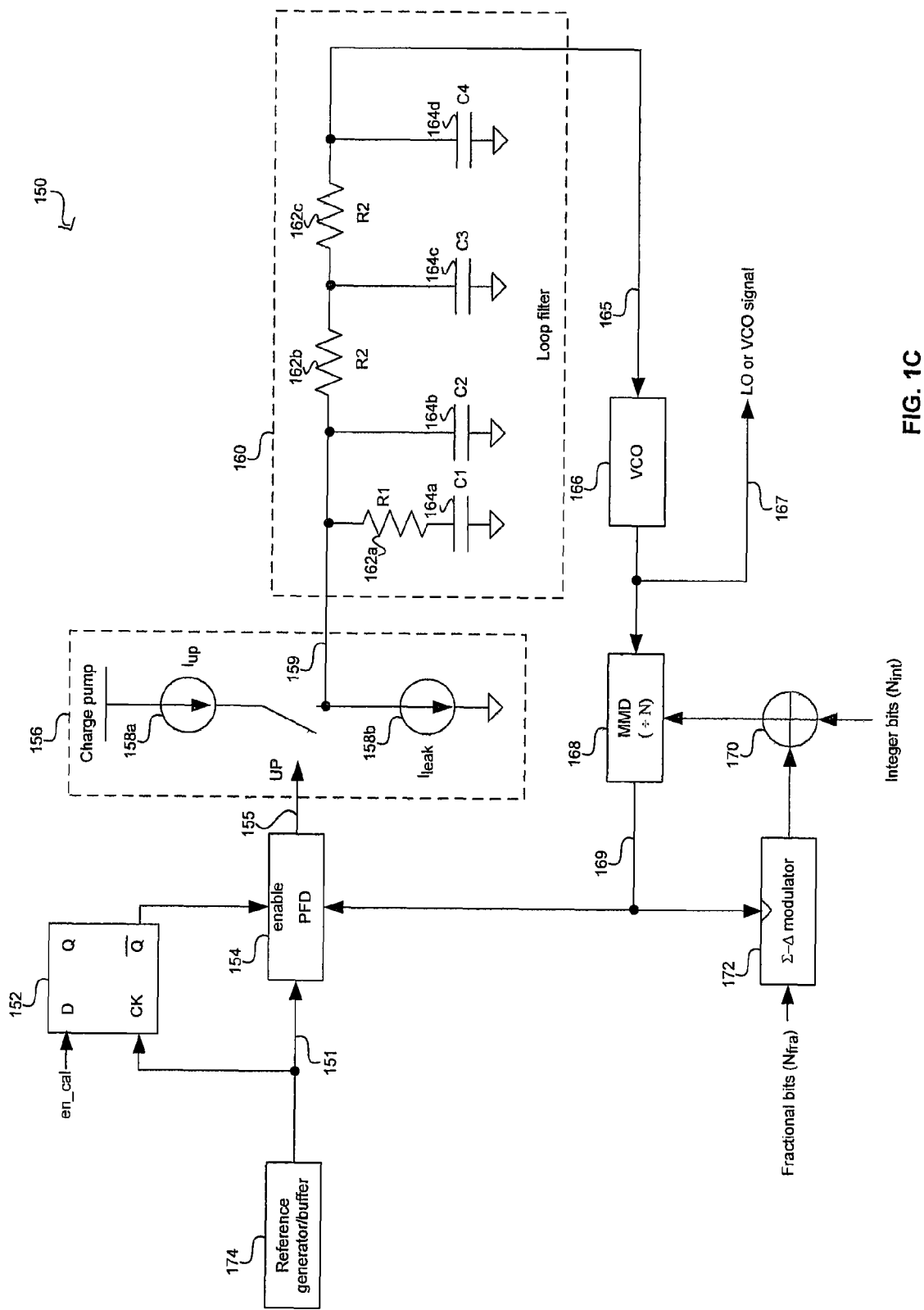
FIG. 1C is a block diagram illustrating an exemplary fractional-N phase-locked-loop (PLL) synthesizer for use in a wireless terminal, in accordance with an embodiment of the invention.

FIG. 1C is a block diagram illustrating an exemplary fractional-N phase-locked-loop (PLL) synthesizer for use in a wireless terminal, in accordance with an embodiment of the invention. Referring to FIG. 1C, there is shown a fractional-N PLL synthesizer 150 that may comprise a D flip-flop 152, a phase-frequency detector (PFD) 154, a charge pump 156, a loop filter 160, a voltage controlled oscillator (VCO) 166, a multi-modulus divider (MMD) 168, an adder 170, a Σ-Δ modulator 172, and a reference generator/buffer 174. The fractional-N PLL synthesizer 150 may correspond to the frequency synthesizer 133c disclosed in FIG. 1B. In this regard, the fractional-N PLL synthesizer 150 may be implemented on a chip and may be integrated with other components of the RF receiver 130, for example.

In one embodiment of the invention, the reference generator/buffer 174 may be communicatively coupled to an off-chip crystal (Xtal) and may operate as a crystal oscillator. The fractional-N PLL synthesizer 150 may be designed for operation with a plurality of crystal frequencies in order to generate the local oscillator (LO) or output reference signal that corresponds to a specified wireless communication protocol operation. In this regard, the fractional-N PLL synthesizer 150 may enable generation of an appropriate output reference signal from the Xtal oscillator for operating in accordance with WLAN system requirements. When the crystal frequency is low, a narrower loop bandwidth may be selected for the fractional-N PLL synthesizer 150 to at least partially reduce out-of-band quantization noise. When crystal frequency is high, a wider loop bandwidth may be selected to at least partially suppress in-band noise produced by the VCO 166.

In another embodiment of the invention, the fractional-N PLL synthesizer 150 may receive an input reference signal from another portion of the RF receiver 130 or from a portion or component from the wireless terminal 120 disclosed in FIG. 1A. The signal may be buffered by the reference generator/buffer 174. In this regard, the fractional-N PLL synthesizer 150 may generate the LO or output reference signal that corresponds to a specified wireless communication protocol operation from the received input reference signal.

The reference generator/buffer 174 may comprise suitable logic, circuitry, and/or code that may enable buffering a received input reference signal. The reference generator/buffer 174 may also enable operation as a crystal oscillator when communicatively coupled to an off-chip crystal. The original frequency of the signal buffered by the reference generator/buffer 174 or the signal generated by the reference generator/buffer 174 operating as a crystal oscillator may be increased by circuitry within the reference generator/buffer 174 that operates as a frequency doubler by generating pulses at both the rising and falling edges of the original reference signal. By doubling the frequency of the signal from the reference generator/buffer 174 to the PFD 154, the PFD 154 may also have to double the phase comparison rate.

The PFD 154 may comprise suitable logic, circuitry, and/or code that may enable controlling the charge pump 156. The PFD 154 may receive an input reference signal, such as the signal 151 from the reference generator/buffer 174, and a divider signal 169 from the MMD 168 in order to generate an UP signal 155 to control the operation of the charge pump 156. The PFD 154 may be enabled by the D flip-flop 152 for general operations and/or during a closed-loop portion of a calibration operation that may be performed on the VCO 166. When the reference generator/buffer 174 utilizes the frequency doubling operation, the PFD 154 may compare the phase at both the rising and falling edges of the original reference signal or original reference clock. This approach may enable improvements to in-band phase noise, by enabling a lower divider ratio, for example, and also to out-of-band noise, by enabling pushing out quantization noise, for example. The improvement may be greater in instances when the reference signal frequency is low.

The charge pump 156 may comprise suitable logic, circuitry, and/or code the may enable generating an output signal 159 that may be utilized for controlling the operation of the VCO 166. The charge pump 156 may comprise a charge up portion 158a and a charge down portion 158b. The UP signal 155 generated by the PFD 154 may be utilized to enable charging up the output signal 159. The charge up portion 158a may correspond to a one side current (Iup), which may be directed by UP signal 155 to charge up the voltage that corresponds to the output signal 159. The charge up portion 158a may be programmable by, for example, the processor 125 and/or the digital baseband processor 129 disclosed in FIG. 1A in accordance with crystal and VCO frequencies to optimize loop characteristics. The charge down portion 158b may correspond to a constant leakage current that creates a phase offset and enables charging down a voltage that corresponds to the output signal 159. As a result, when the fractional-N PLL synthesizer 150 locks in, the phase error may be away from the zero crossing point, which may lead to a better charge pump linearity. A more linear charge pump may reduce quantization noise folding and lower close-in fractional spur, for example. The charge down portion 158b may be programmable by, for example, the processor 125 and/or the digital baseband processor 129 disclosed in FIG. 1A, in accordance with the charge up portion 158a.

The loop filter 160 may comprise suitable logic, circuitry, and/or code that may enable filtering the output signal 159 generated by the charge pump 156 to produce a filtered signal 165 that may be utilized for controlling the operation of the VCO 166. In one embodiment of the invention, the loop filter 160 may comprise resistors R1 162a, R2 162b, and R3 162c, and capacitors C1 164a, C2 164b, C3 164c, and C4 164d. The components of the loop filter 160 may be programmable by, for example, the processor 125 and/or the digital baseband processor 129 disclosed in FIG. 1A, in accordance with crystal and VCO frequencies to optimize loop characteristics. Notwithstanding the exemplary embodiment disclosed in FIG. 1C, other loop filter designs may be utilized for the loop filter 160.

The VCO 166 may comprise suitable logic, circuitry, and/or code that may enable generation of a local oscillator or output reference signal 167 based on the filtered signal 165 that results by filtering in the loop filter 160 the output signal 159 generated by the charge pump 156. The VCO 166 may utilize a programmable conversion factor ($K_{VCO}$) for determining the output reference signal frequency in accordance with the voltage level of the filtered signal 165. In this regard, the $K_{VCO}$ may be programmable in accordance with the frequency of the VCO 166.

The MMD 168 may comprise suitable logic, circuitry, and/or code that may enable dividing the frequency of the output reference signal 167 generated by the VCO 166 to generate the divider signal 169. The MMD 168 may receive an integer divider number from the addition performed by the adder 170 of the integer bits (Nint) and the output of the Σ-Δ modulator 172. In this regard, the fractional divider ratio N is generated by dithering between a plurality of integer values in accordance with the output of the Σ-Δ modulator 172. The MMD 168 may utilize true single phase clock (TSPC) logic in at least the high-speed portions of the design to enable the MMD 168 to run at full VCO speed to keep quantization noise from Σ-Δ modulator 172 at a minimum and to enable the charge pump 156 to have better linearity. The use of TSPC logic may also provide power savings when compared to conventional high-speed logic such as source-coupled logic (SCL) and current mode logic (CML), for example. Moreover, the MMD 168 may re-synchronize the divider signal 169 with the output reference signal 167 generated by the VCO 166. Re-synchronization may reduce phase noise generated by the MMD 168 and may also enable reduction in quantization noise folding and in close-in fractional spur.

The Σ-Δ modulator 172 may comprise suitable logic, circuitry, and/or code that may enable generating a signal to be added to integer bits (Nint) of the fractional divider ratio N based on fractional bits (Nfra) of the fractional divider ratio N. The clock that drives the Σ-Δ modulator 172 may be derived from the divider signal 169 generated by the MMD 168. In this regard, the fractional divider ratio N may be obtained from the following expression: $N=f_{VCO}/f_{REF}$, where $f_{VCO}$ is the frequency of the LO or output reference signal 167 and $f_{REF}$ is the frequency of the input reference signal 151. The integer portion of N is represented by the integer bits $N_{int}$ while the fractional portion of N represented by the fractional bits $N_{fra}$. The output of the Σ-Δ modulator 172 is a stream of integer values that when added to $N_{int}$ produce an average value that approximates the fractional divider ratio N.

Figure 2:
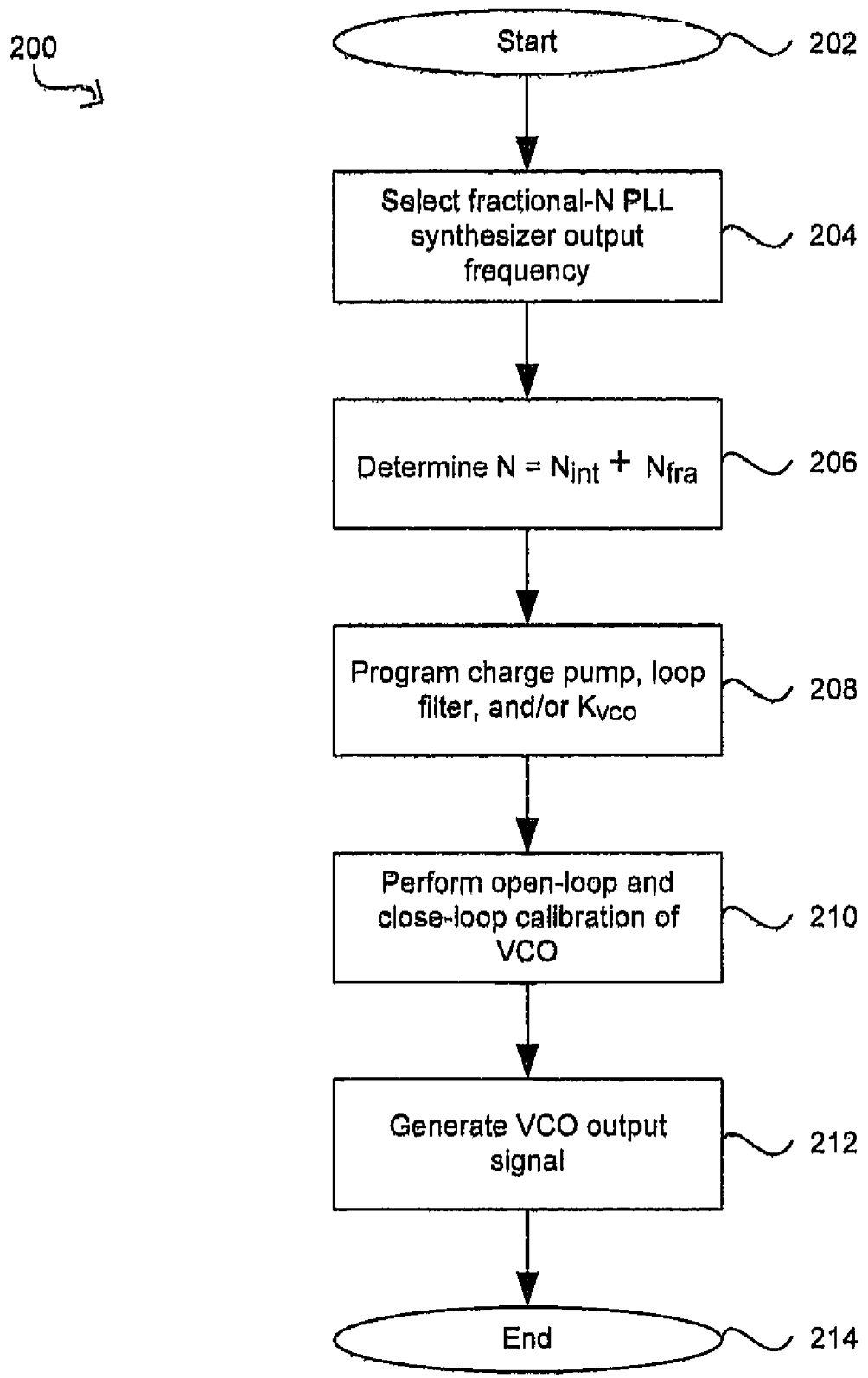
FIG. 2 is a flow diagram illustrating exemplary steps in the operation of a fractional-N PLL synthesizer, in accordance with an embodiment of the invention.

FIG. 2 is a flow diagram illustrating exemplary steps in the operation of a fractional-N PLL synthesizer, in accordance with an embodiment of the invention. Referring to FIG. 2, there is shown a flow diagram 200. In step 204, after start step 202, the output reference signal frequency, $f_{VCO}$, for the fractional-N PLL synthesizer 150 may be selected in accordance with the frequency band of the RF signals received by, for example, the RF receiver 130 disclosed in FIG. 1B. In this regard, the frequency band may depend on the wireless communication protocol being utilized.

In step 206, the fractional divider ratio N may be determined based on the output reference signal frequency, $f_{VCO}$, and the frequency of the input reference signal, $f_{REF}$. The fractional divider ratio N may have an integer portion that is represented by the integer bits $N_{int}$ that may be stored in memory, such as the memory 127 disclosed in FIG. 1A, and that may be communicated to the adder 170. The divider ratio N may also have a fractional portion that is represented by the fractional bits $N_{fra}$ that may be stored in memory and that be communicated to the $\Sigma$-$\Delta$ modulator 172. In this regard, a plurality of values for $N_{int}$ and $N_{fra}$ may be stored in memory to support a wide range of output reference signal and input reference signal frequencies. In step 208, at least a portion of the charge pump 156, the loop filter 160, and/or the VCO 166 may be programmed to optimize the loop characteristics for a particular set of operational conditions.

In step 210, a calibration or tuning of the VCO 166 may be performed. In this regard, the tuning of the VCO 166 may comprise a coarse tuning operation that may be carried out by utilizing a plurality of switching capacitors and a fine tuning operation that may be carried out by utilizing a plurality of varactors. The coarse tuning may be performed by utilizing an open-loop calibration where the loop filter 160 is disconnected from the VCO 166. The fine tuning may be performed during a closed-loop settling where the loop filter 160 is connected to the VCO 166. Long settling time that may arise in going from an open-loop calibration operation to a closed-loop operation that may be caused by replacing a large down current with a small leakage current in the charge pump 156 may be addressed by properly enabling and/or disabling the PFD 154 via the D flip-flop 152. In step 212, the fractional-N PLL synthesizer 150 may generate a LO or output reference signal from the VCO 166 in accordance with the wireless communication protocol being utilized. After step 212, the process may proceed to end step 214.

The approach and design described above may enable the implementation of a fractional-N PLL frequency synthesizer that may provide reduced power requirements, improved noise performance, and/or higher operating bandwidth to enable the operation of wireless terminals that may support, for example, advanced WLAN system requirements.

In an embodiment of the invention, the fractional-N PLL synthesizer 150 may be integrated on a chip, for example. The reference generator/buffer 174 may be operated as a buffer to an input reference signal coupled to the chip or may be operated as a crystal oscillator when communicatively coupled to an off-chip crystal. The reference generator/buffer 174 in the fractional-N PLL synthesizer 150 may enable increasing the frequency of the original reference signal before communicating the reference signal to the PFD 154. The PFD 154 may also enable generation of a single signal for controlling the charge pump 156 utilizing the increased frequency reference signal and a divider signal 169 generated by a divider, such as the MMD 168, whose input frequency may be substantially the same as that of a VCO signal 167 generated by the fractional-N PLL synthesizer 150. The single signal generated by the PFD 154 may enable charging a charge up portion 158a of the charge pump 156 and a charge down portion 158b of the charge pump 156 is charged by a leakage current. The VCO 166 may generate the VCO signal 167 based on a filtered output of the controlled charge pump 156 generated by the loop filter 160. The MMD 168 may utilize true single phase clock (TSPC) logic to generate the divider signal 169.

The fractional-N PLL synthesizer 150 may enable programming of the charge pump 156, the loop filter 160, and/or the VCO 166. The fractional-N PLL synthesizer 150 may also enable configuration of the MMD 168 to modify the frequency of the VCO signal 167.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for signal processing, the method comprising:

in a reference generator, increasing a frequency of an input reference signal utilized by a phase-frequency detector (PFD) in a fractional-N phase-locked-loop (PLL) synthesizer comprising said reference generator, said PFD, a charge pump, a divider, a voltage controlled oscillator (VCO), and a loop filter;

generating an enable signal for said PFD utilizing said increased frequency input reference signal;

generating a single signal for controlling said charge pump utilizing said increased frequency input reference signal and a divider signal generated by said divider whose input frequency is substantially the same as that of a VCO signal generated by said fractional-N PLL synthesizer, wherein said single signal enables a switched charge up portion of said charge pump to charge said loop filter and wherein said loop filter is discharged by an unswitched leakage current in said charge pump that is independent of said single signal; and generating said VCO signal based on a filtered output of said controlled charge pump, wherein said filtered output is generated by said loop filter.

2. The method according to claim 1, wherein said divider is a multi-modulus divider (MMD).

3. The method according to claim 1, wherein said divider utilizes true single phase clock (TSPC) logic to generate said divider signal.

4. The method according to claim 1, wherein said fractional-N PLL synthesizer is integrated on a chip.

5. The method according to claim 4, comprising generating said input reference signal to said PFD in said reference generator based on buffering a reference signal communicatively coupled to said chip or based on operating said reference generator as a crystal oscillator when communicatively coupled to an off-chip crystal.

6. The method according to claim 1, comprising programming said charge pump.

7. The method according to claim 1, comprising programming said loop filter.

8. The method according to claim 1, comprising configuring said divider to modify said generated VCO signal frequency.

9. The method according to claim 1, comprising configuring a conversion factor in said VCO.

10. The method according to claim 1, comprising generating said enable signal utilizing a flip-flop that receives said increased frequency input reference signal.

11. A system for signal processing, the system comprising:
a fractional-N phase-locked-loop (PLL) synthesizer comprising a reference generator, a charge pump, a divider, a voltage controlled oscillator (VCO), a loop filter, and a phase-frequency detector (PFD);
said reference generator enables increasing a frequency of an input reference signal to said PFD;
said increased frequency input reference signal is utilized to generate an enable signal for said PFD;
said PFD enables generation of a single signal for controlling said charge pump utilizing said increased frequency input reference signal and a divider signal generated by said divider whose input frequency is substantially the same as that of a VCO signal generated by said fractional-N PLL synthesizer, wherein said single signal enables a switched charge up portion of said charge pump to charge said loop filter and wherein said loop filter is discharged by an unswitched leakage current in said charge pump that is independent of said single signal; and
said VCO generates said VCO signal based on a filtered output of said controlled charge pump, wherein said filtered output is generated by said loop filter.

12. The system according to claim 11, wherein said divider is a multi-modulus divider (MMD).

13. The system according to claim 11, wherein said divider utilizes true single phase clock (TSPC) logic to generate said divider signal.

14. The system according to claim 11, wherein said fractional-N PLL synthesizer is integrated on a chip.

15. The system according to claim 14, wherein said reference generator enables generating said input reference signal to said PFD based on buffering a reference signal communicatively coupled to said chip or based on operating said reference generator as a crystal oscillator when communicatively coupled to an off-chip crystal.

16. The system according to claim 11, wherein said fractional-N PLL synthesizer enables programming of said charge pump.

17. The system according to claim 11, wherein said fractional-N PLL synthesizer enables programming of said loop filter.

18. The system according to claim 11, wherein said fractional-N PLL synthesizer enables configuration of said divider to modify said generated VCO signal frequency.

19. The system according to claim 11, wherein said fractional-N PLL synthesizer enables configuration of a conversion factor in said VCO.

20. The system according to claim 11, wherein said fractional-N PLL synthesizer enables generating said enable signal utilizing a flip-flop that receives said increased frequency input reference signal.

* * * * *